US006999672B2

(12) United States Patent
Munk

(10) Patent No.: US 6,999,672 B2
(45) Date of Patent: Feb. 14, 2006

(54) WAVEGUIDE TO MICROSTRIP TRANSITION

(75) Inventor: Marco Munk, Aichwald (DE)

(73) Assignee: Marconi Communications GmbH, Backnang (DE)

(*) Notice: Subject to any disclaimer, the term of this patent is extended or adjusted under 35 U.S.C. 154(b) by 0 days.

(21) Appl. No.: 10/502,312

(22) PCT Filed: Jan. 24, 2003

(86) PCT No.: PCT/IB03/00610

§ 371 (c)(1), (2), (4) Date: Mar. 7, 2005

(87) PCT Pub. No.: WO03/063297

PCT Pub. Date: Jul. 31, 2003

(65) Prior Publication Data

US 2005/0163456 A1 Jul. 28, 2005

(30) Foreign Application Priority Data

Jan. 24, 2002 (DE) ................................ 102 02 824

(51) Int. Cl.
*G02B 6/00* (2006.01)
*G01R 27/04* (2006.01)

(52) U.S. Cl. ....................... 385/147; 324/631; 343/771

(58) Field of Classification Search ............ 385/16–18, 385/147; 343/771; 324/631
See application file for complete search history.

(56) References Cited

U.S. PATENT DOCUMENTS

| | | | | |
|---|---|---|---|---|
| 4,513,291 | A * | 4/1985 | Drabowitch | 343/771 |
| 5,017,893 | A * | 5/1991 | Izumi et al. | 332/103 |
| 5,173,714 | A * | 12/1992 | Arimura et al. | 343/771 |
| 5,831,583 | A * | 11/1998 | Lagerstedt et al. | 343/771 |
| 6,069,543 | A * | 5/2000 | Ishikawa et al. | 333/219.1 |
| 6,100,703 | A * | 8/2000 | Davidov et al. | 324/631 |
| 6,445,845 | B1 * | 9/2002 | Sakata et al. | 385/18 |
| 2004/0150829 | A1 * | 8/2004 | Koch et al. | 356/477 |

* cited by examiner

*Primary Examiner*—Akm Enayet Ullah
(74) *Attorney, Agent, or Firm*—Kirschstein, et al.

(57) ABSTRACT

A waveguide coupling device comprises a waveguide section in which a guided wave may be propagated in at least one waveguide mode and which has two slits in one of its walls. The waveguide mode has a field component parallel to the slotted wall with a nodal plane oriented in the longitudinal direction of the waveguide section, and/or it induces in the walls of the waveguide section a wall current distribution with just such a nodal plane. The slits lie on opposing sides of the nodal plane. One or two antenna sections bridge the first slit or both slits.

20 Claims, 5 Drawing Sheets

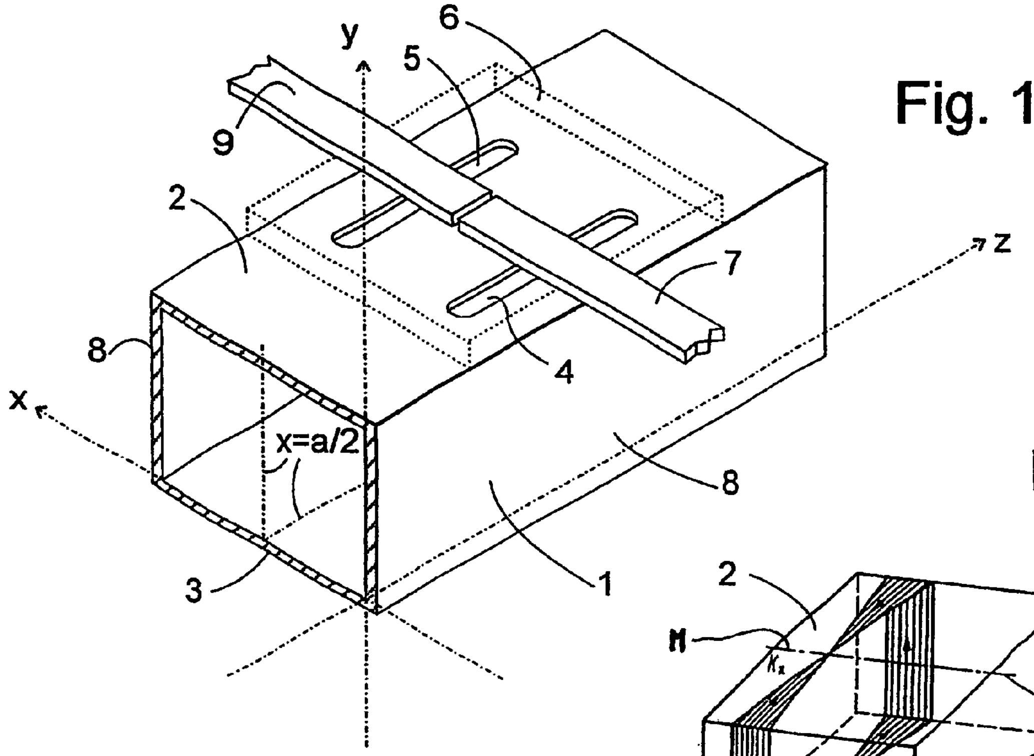
Fig. 1
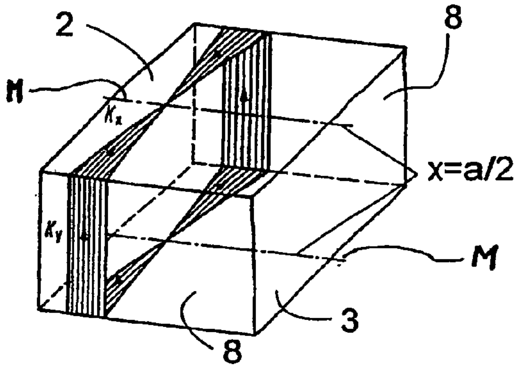
Fig. 2
Fig. 3
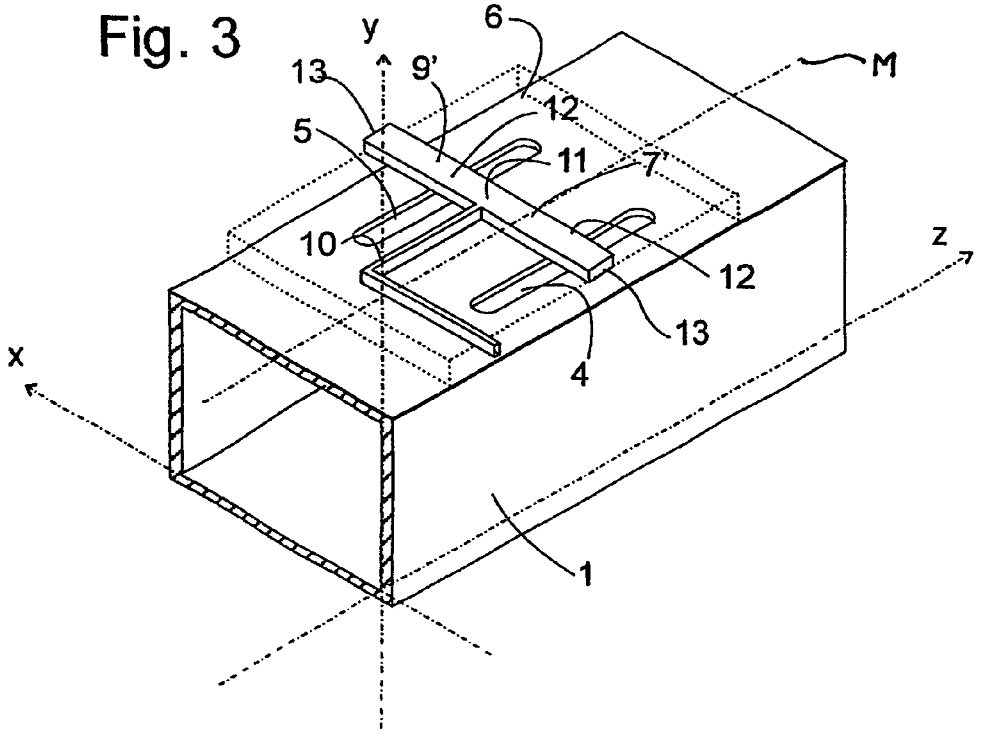

WAVEGUIDE TO MICROSTRIP TRANSITION

The present invention concerns a device for coupling a radio frequency signal propagating in a metallic conductor into a waveguide or from a waveguide into a metallic conductor.

Conventional coupling devices of this type comprise a waveguide section in which a guided wave is capable of propagating in at least one waveguide mode and which has a slit in one of its walls, through which the field of the waveguide mode emerges and is capable of exciting an oscillation in an antenna section arranged outside the waveguide section, bridging the slit.

Only a part of the radio frequency energy emerging through the slit is actually utilised for exciting the oscillation in the antenna section; the remainder is radiated into the free space lying above the slit. This is undesirable, not only because the energy is thereby radiated unused, but because it may have an interfering influence on equipment components situated in the free space.

If, for instance, a coupling device of this type is used in a group antenna in order, via slits in the walls of a waveguide and antenna sections arranged crossing it, to feed individual antenna elements of the group antenna, then the interference radiation emerging from the slits may sensitively impair the field pattern of the group antenna.

In W. Keusgen and B. Rembold, "broadband Planar Subarray for Microwave WLAN Applications", MIOP, Stuttgart, 2001, it is proposed to circumvent this problem in that the interference radiation is coupled into a radiator element which actively contributes to the function of the group antenna. This solution involves a significant calculation effort, however, and is not generally applicable.

In F. J. Villegas, D. I. Stones, H. A. Hung: "A Novel Waveguide-to-Microstrip Transition for Millimeter Wave Applications", IEEE Trans. on Microwave Theory and Techniques, vol. 47, No. 1, January 1999, it is proposed that the interference radiation be suppressed with the aid of cover caps placed over the respective slits to prevent emergence of the interference radiation. However, this solution is complex in the implementation, since for every slit such a cover with fed-through antenna section is required.

It is an aim of the present invention to provide a waveguide coupling device of the aforementioned type in which the emergence of interference radiation is effectively suppressed in simple manner and which may be manufactured with little effort.

This aim is fulfilled by providing, in the side wall which has the first slit, a second slit which is so arranged that the two slits lie on opposite sides of a nodal line of a field component of the waveguide mode that is oriented parallel to the slotted wall.

The invention is preferably applied to a waveguide of rectangular cross-section and particularly to its principal mode, known as the magnetic fundamental wave or the $H_{10}$ wave. Based on the explanations given here, however, a person skilled in the art will be able to apply the invention also to other waveguide cross-sections and waveguide modes.

If a coordinate system is established whereby the X-axis is perpendicular to a narrow side wall and the Y-axis is perpendicular to a broad side wall of the waveguide section and the Z-axis extends in the longitudinal direction of the waveguide section, the $H_{10}$ wave has field components $H_x$ and $H_z$ parallel to a broad side wall of the waveguide. Of these components, the component $H_z$ has a nodal plane, which extends in the longitudinal direction of the waveguide section and intersects its two broad side walls centrally. The $H_z$ component has opposite signs on the different sides of the nodal plane. Thus the fields emerging from the two slits and originating from the $H_z$ component oscillate with opposing phase and tend to cancel each other out in the radiation zone. The $E_y$ component of the $H_{10}$ wave excites, in the side walls of the waveguide section, cross-currents which flow in opposing directions on either side of the same nodal plane and evoke opposite-oriented electric fields in the X-direction at the two slits. These also tend to cancel each other out in the radiation zone.

This cancellation is all the more complete, the more symmetrical is the arrangement of the two slits in relation to the nodal plane. If the locus of one slit is the reflection of the other with respect to the nodal plane, then their $E_x$ components compensate each other completely in the radiation zone on the nodal plane, provided the symmetry is not broken by the antenna section crossing the first slit, and are severely reduced laterally by this compared with the field of a waveguide section having a single slit.

With an inversion symmetry arrangement of the slits relative to a point in the nodal plane, that is to say, the locus of one slit is the inverted reflection of the other with respect to the nodal plane, sufficient compensation may also be achieved, provided the extent of the slits in the Z-direction is significantly smaller than the wavelength of the waveguide mode and thus phase differences between the fields at inversion symmetrical points of the two slits can be ignored.

The antenna section is in general linked at one end to a conductor for conducting away the coupled-in RF signal and free at its other end. This free end may preferably be placed at a distance of $\lambda_s/4$ from the slit, either fixed or adjustable, where $\lambda_s$ is the wavelength of the signal induced in the antenna section. This achieves the result that a portion of the coupled-in signal propagating in the antenna section from the slit directly in the direction of the connecting conductor and a portion initially reflected at the free end are constructively combined, so that a strong coupling is achieved.

In order to avoid break of symmetry through an intersecting antenna section, a second antenna section may advantageously be arranged bridging the second slit. This antenna section may be employed for feeding a different RF component from that fed by the first antenna section, or for feeding the same RF component.

According to a preferred embodiment, in the latter case, two antenna sections are linked at one point parallel to a connecting conductor, i.e. they each have one end linked to the connecting conductor and one free end.

The antenna sections may be so arranged that they cross the slits assigned to them in respective opposing directions, i.e. their free ends either both lie between the slits or both beyond the slits. In this case it is preferred that the antenna sections should have a total length L between $(n-3/8)\lambda_s$ and $(n+3/8)\lambda_s$, where n is an integer and $\lambda_s$ is the wavelength of the oscillation induced in the antenna sections by the guided wave. If L is exactly equal to $n\lambda_s$, then the oscillations coupled at the two slits in the antenna sections interfere exactly cophasally and optimum coupling is achieved. Values deviating from $n\lambda_s$ may be used if a weaker coupling is desired.

If, on the other hand, the antenna sections cross their slits in the same direction, i.e. if the free end of one antenna section lies between the slits and that of the other lies beyond the slits, then the oscillations induced at the slits interfere cophasally at a total length L of $(n+\frac{1}{2})\lambda_s$, by reason of which a total length L of between $(n+\frac{1}{8})\lambda_s$ and $(n+\frac{7}{8})\lambda_s$ is preferred.

Another possibility is to link the two antenna sections in series; in this case, for a cophasal superposition of the oscillations induced at the two slits, a spacing between the slits measured along the antenna sections of approximately $n\lambda_s$ if the antenna sections cross the slits in opposing directions, or of approximately $(n+\frac{1}{2})\lambda_s$ is required if the antenna sections cross the slits in the same direction.

Preferably, the crossing points of the antenna sections with the slits lie on a line perpendicular to the longitudinal direction of the waveguide section or to the nodal plane.

It is thereby ensured that the two antenna sections are exposed to cophasal exciting fields emerging from the slits, independently of the exact position in which the antenna sections are arranged in relation to the waveguide section. It is particularly suitable if the antenna sections lie, at least in the region of the crossing points, on a common line, so that the phase coincidence of the fields to which the two antenna sections are exposed is maintained even on transverse displacement of the antenna sections.

According to a first preferred embodiment, the two slits are parallel to each other and to the nodal plane, so that the coupling strength does not depend on the position of the antenna sections in the propagation direction of the guided wave (the Z-direction), but is determined exclusively by the position of the antenna sections transverse to the nodal plane, i.e. by the spacing of their crossing points from the free ends.

According to a second preferred embodiment, the slits run parallel and inclined to the nodal plane. The degree of deviation from parallelism influences the strength of the $H_z$ field emerging from the slits and coupling into the antenna sections and thus the coupling constant of the coupling device. In particular if the slits are arranged on a rotatable wall section of the waveguide section, by rotation of this wall section, the coupling constant may be adjusted as required.

According to a third preferred embodiment, the slits have a spacing varying along the nodal plane and the antenna sections are positionable in different positions along the nodal plane. In this case, the coupling coefficient may be set by suitable positioning of the antenna sections along the nodal plane. The nearer the slits lie to the nodal plane, the smaller is the field component parallel to the wall in the waveguide behind the slits and the smaller are the wall currents induced at the site of the slits, and the smaller therefore is the emerging field to which the antenna sections are exposed.

In the first and third embodiments, it may be provided that, when manufacturing the coupling device, the antenna sections are firmly placed at a site, whereby the antenna sections may be fixed at several positions on the waveguide section and the position in an individual case is selected on the basis of a desired coupling coefficient. Alternatively, the possibility exists of providing a device for adjusting the antenna sections relative to the slits, in order also to be able to adapt the coupling coefficients of the finished coupling device to requirements at any time.

Further features and advantages of the invention are given in the following description of examples by reference to the attached drawings, in which FIG. 1 shows a perspective view of a coupling device according to a first embodiment of the invention;

FIG. 2 shows the distribution of the cross-currents in the wall of the waveguide section of the coupling device according to FIG. 1;

FIG. 3 shows a second embodiment of a coupling device according to the invention in a perspective view analogous to FIG. 1;

Figure 4:
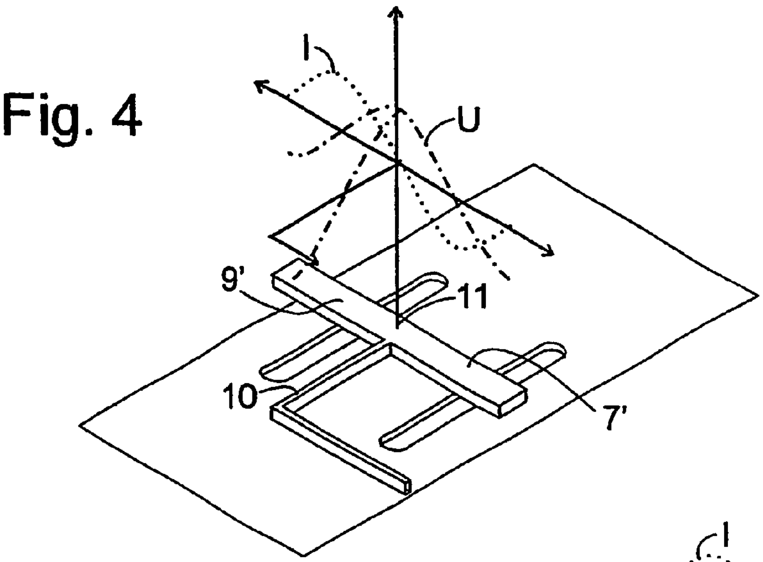
FIG. 4 shows an instantaneous current and voltage distribution in the antenna sections and the connecting conductor in the embodiment according to FIG. 3.

The coupling device shown in FIG. 1 comprises a waveguide section 1 of rectangular cross-section, having an upper broad side wall 2, a lower broad side wall 3 and narrow side walls 8, in which the waveguide mode $H_{10}$ is capable of propagation. This waveguide mode has non-vanishing field components $H_x$, $H_z$ and $E_y$, where $H_x$ and $E_y$ are proportional to $\sin(\pi x/a)$ and $H_z$ is proportional to $\cos(\pi x/a)$, where a is the width of the broad side walls 2, 3 and the narrow side walls 8 lie at coordinate values x=0 and x=a in the xyz-coordinate system shown. The field component $H_z$ has a nodal plane at x=a/2.

A first slit 4 extends in the upper broad side wall 2 in the direction of the z axis. A second slit 5 is arranged relative to the nodal plane x=a/2 as a mirror image of the first slit 4. Fields emerging from the two slits 4, 5 are composed of contributions from the non-vanishing field components passing through the slit, and electric fields in the x-direction resulting from the fact that the slits 4, 5 block the path of cross-currents flowing in the waveguide wall and evoked by the waveguide mode. These cross-currents, illustrated schematically in FIG. 2, have opposite signs on different sides of the nodal plane x=a/2. The nodal plane is represented by chain-dashed lines M. Their contribution to the emerging fields is greater the stronger the cross-currents are at the site of the slits 4, 5, i.e. the further these are removed from the nodal plane. The contributions of the cross-currents and of the component $H_z$ of the waveguide mode to the field outside the waveguide have opposite signs on different sides of the nodal plane, so that these fields cancel each other out in the radiation zone. The field components $H_x$, $E_y$ have the same sign on both sides of the nodal plane, so that they do not cancel each other out in the radiation zone, although their field strength approaches zero with increasing proximity to the narrow side walls 8, so that their contribution to the field outside the waveguide section also is smaller the nearer the slits 4, 5 lie to the narrow side walls 8.

On the upper broad side wall 2 is arranged a dielectric substrate 6, which bears a first strip line 7 bridging the first slit 4. The strip line 7 serves as an antenna section in which an electromagnetic oscillation is induced by the electric field evoked by the cross-currents. This oscillation may be used to feed an antenna element of a group antenna or another RF component.

A second strip line 9 may be arranged in mirror image fashion to the strip line 7 over the second slit 5. Its function is the same as that of the first strip line; it may be used to feed the same RF component as the first strip line 7, or a second RF component.

In the second embodiment of the coupling device according to the invention shown in FIG. 3, the waveguide section 1 is the same as in FIG. 1 and will therefore not be described again. Two strip lines 7', 9' formed on a substrate 6 extend on a common line parallel to the X-axis and are linked to each other at their ends facing each other and joined to a common connecting conductor 10.

In the embodiment according to FIG. 3, the connecting point 11 of the ends facing each other of the connecting conductor 10 lies on the nodal plane x=a/2 of the field component $H_z$. It is to be noted that, in this and subsequent figures, the lower of the two lines M delineating the plane x=a/2 shown in FIG. 2 has been omitted for clarity. The spacing of the crossing points 12 of the strip lines 7', 9' from their respective free ends 13 is $\lambda_s/4$, and the spacing of the two crossing points 12 is $\lambda_s/2$, where $\lambda_s$ is the wavelength of the oscillation induced in the strip lines by the waveguide mode. The two strip lines 7', 9' thus form a resonator matched to the waveguide mode of length $\lambda_s$. In the resonator a standing wave forms, whose current and voltage pattern is illustrated by the dotted curve 1 and the dot-dashed curve U in FIG. 4. At the connecting point 11, there is a node in the current distribution. The amplitude of the voltage is a maximum here, so that a strong signal may be drawn off via the connecting conductor 10.

Figure 5:
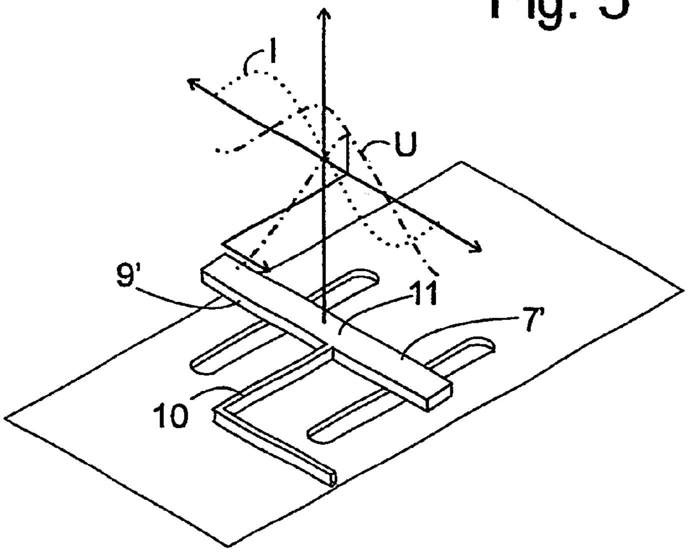
FIG. 5 shows the current and voltage distribution in an embodiment slightly altered relative to FIG. 3.

In the variation shown in FIG. 5, the connecting point 11 does not lie centrally between the two free ends 13, but is displaced towards the free end of the strip line 7'. The voltage level difference at the connecting point 11 is lower than in the case in FIG. 4, and the signal drawn off via the connecting conductor 10 is weaker. It is therefore possible, independently of a coupling coefficient required in an individual case, to manufacture the waveguide section 1 with the slits 4, 5, the substrate 6 and the strip lines 7', 9' in a standard form and through contacting of the connecting conductor 10 at a suitably selected connecting point 11, to realise a coupling strength required in an individual case.

Variable coupling coefficients are also realisable with the design according to FIG. 3 if, on the one hand, the waveguide section 1 and, on the other hand, the substrate 6 with the strip lines 7', 9' situated on it and the connecting conductor 10 are manufactured in a standard form. In order to vary the coupling, it is sufficient to vary the position of the substrate and the conductors situated on it transverse to the nodal plane x=a/2. This leads to a deviation of the spacing between the crossing points 12 and the free ends 13 from the optimum value $\lambda_s/4$.

By suitable selection of the position of the substrate 6, it is thus possible to set the strength of the coupling between the waveguide section 1 and the strip lines 7', 9'. This significantly simplifies the manufacture of coupling devices with different coupling strengths, since it is not necessary to set the position of the slits 4, 5 according to a desired coupling strength and to manufacture a plurality of waveguide sections with differing slit spacings, but the waveguide sections 1 may be manufactured in large quantities with a fixed position of the slits and the desired coupling strength may be subsequently selected by suitable positioning of the substrate 6.

Naturally, the spacings of the crossing points 12 from the free ends 13 and the spacings of the crossing points 12 from each other do not have to be $\lambda_s/4$ and $\lambda_s/2$, respectively, at the same time. Indeed, strong coupling may be achieved with such spacings, but only within a very narrow frequency range. If, for at least one of these spacings, a not exactly optimal value is chosen, but rather one lying close to it, then at somewhat reduced coupling strength, the bandwidth of the coupling device may be significantly increased.

Figure 6:
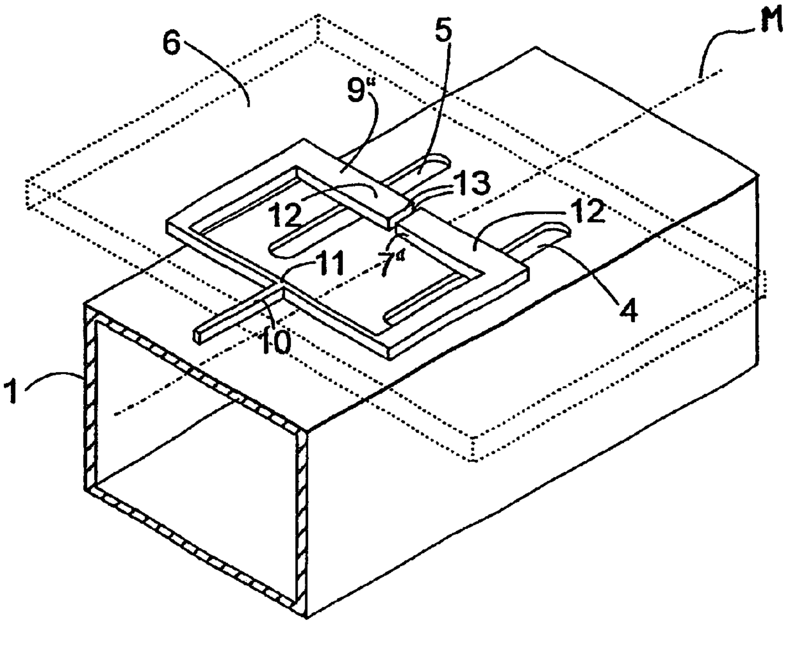
FIG. 6 shows a modification of the embodiment shown in FIG. 3.

A variation of the principle in FIG. 3 is shown in FIG. 6. The waveguide section 1 is the same again as in FIGS. 1 and 3, and the strip lines 7", 9" deposited on the substrate 6 differ from those in FIG. 3 in that the resonator formed by them is C-shaped, and that the free ends 13 of the conductor sections 7", 9" both lie between the slits 4, 5. The method of operation otherwise corresponds to that of the example in FIG. 3.

Figure 7:
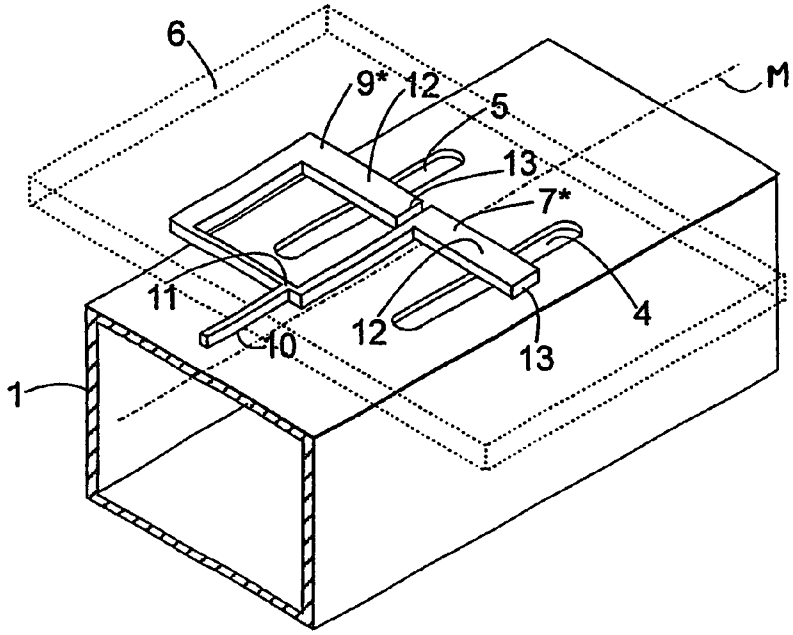
FIGS. 7–9 show respective perspective views of third, fourth and fifth embodiments.

The embodiment shown in FIG. 7 differs from that previously considered in that in this case the two strip lines 7*, 9* formed on the substrate 6 cross the slits 4, 5 of the waveguide section 1 assigned to them in the same direction; their free ends 13 lie, respectively, on the side of the slits 4, 5 facing towards the viewer in the perspective of FIG. 7. For strong coupling of the strip lines 7*, 9* to the waveguide section 1, a cophasal overlaying of the oscillations coupled into the two strip lines 7*, 9* and thus a spacing between the two crossing points 12 of the slits 4, 5 with the strip lines 7*, 9* of $(n+\frac{1}{2})\lambda_s$ is required. The strength of the signal drawn off at the connecting conductor 10 may be influenced, as in the example in FIG. 3, by selecting the position of the connecting points 11 of the connecting conductor 10 and by selecting the spacing between the crossing points 12 and the free ends 13 of the strip lines.

Figure 8:
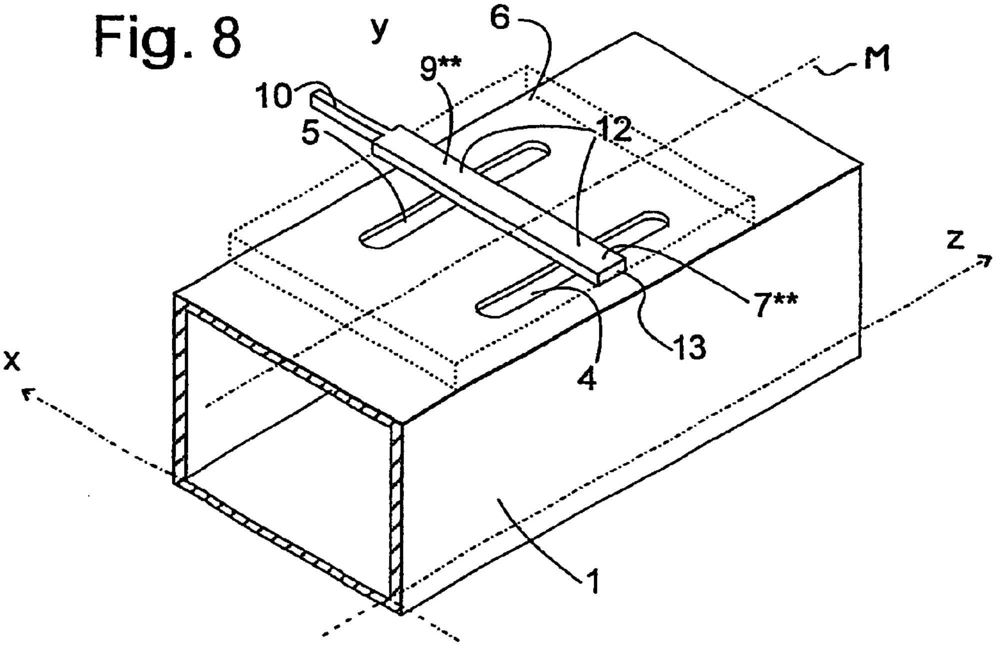

A particularly simple embodiment with strip lines 7, 9** crossing the slits 4, 5 of the waveguide section 1 in the same direction is shown in FIG. 8. The strip line 9** crossing the slit 5 is connected in series between the strip line 7** and the connecting conductor 10. The crossing points 12 have a spacing from the single free end 13** of $\lambda_s/4$ and $3\lambda_s/4$, respectively.

Figure 9:
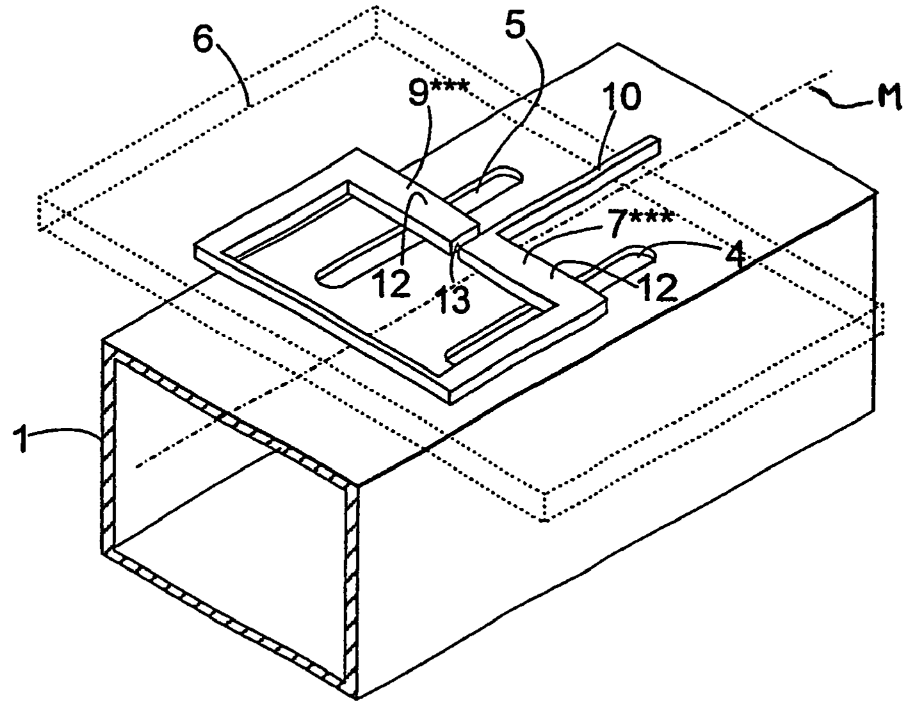

FIG. 9 shows a further embodiment with strip lines 7*, 9*** connected in series and crossing the slits 4, 5** in the same direction.

Figure 10:
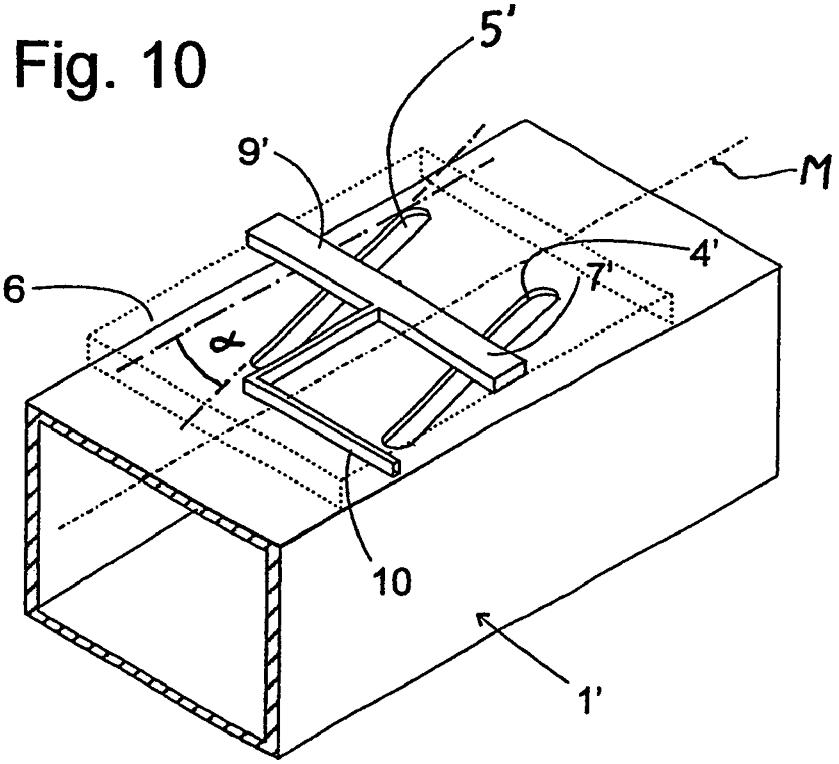
FIG. 10 shows a further modification of the embodiment according to FIG. 3.

A further embodiment of the coupling device is shown in FIG. 10. Here, the substrate 6 and the strip lines 7', 9' formed thereon are identical to those in FIG. 3; the waveguide section 1' has been altered. Its slits 4', 5' run parallel to each other, but at a non-vanishing angle $\alpha$ to the nodal plane x=a/2. Slit 4' can be considered to the inverted reflection of slit 5' about the nodal plane.

The length of the slits in the Z-direction is chosen such that the phase difference of the fields at opposing ends of the slits 4', 5' is not more than 15°. The angle $\alpha$ influences the strength of the $H_z$ component of the waveguide mode emerging through the slits 4', 5' and thus the strength of the magnetically induced current in the strip lines 7', 9'. At an angle $\alpha=0$, this is a maximum; at a value of 90°, it would vanish.

Figure 11:
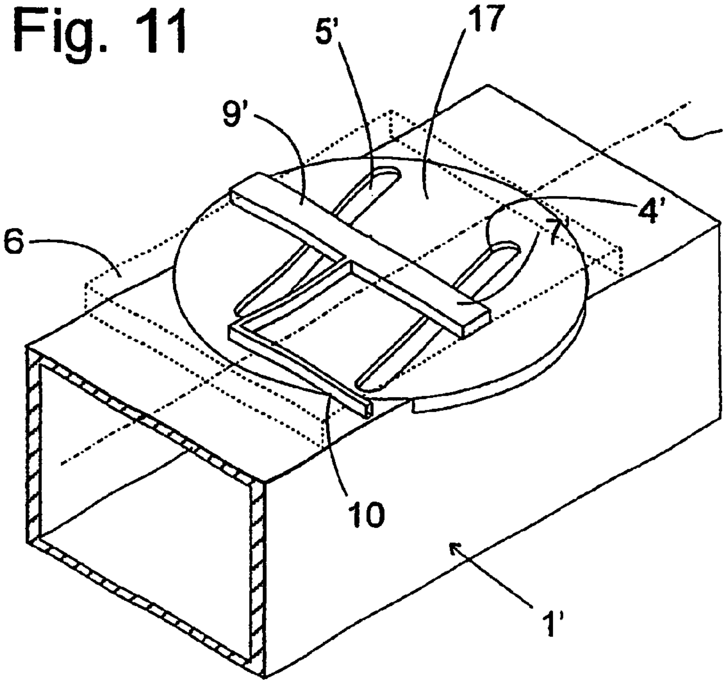
FIG. 11 shows a further development of the embodiment in FIG. 10.

A further development of this embodiment is shown in FIG. 11. Here, the slits 4', 5' are arranged in a circular disk 17 comprising part of the upper wall of the waveguide section 1'. Through rotation of the disk 17, the angle $\alpha$ between the slits 4', 5' and the nodal plane is variable and the coupling strength may be adjusted.

Figure 12:
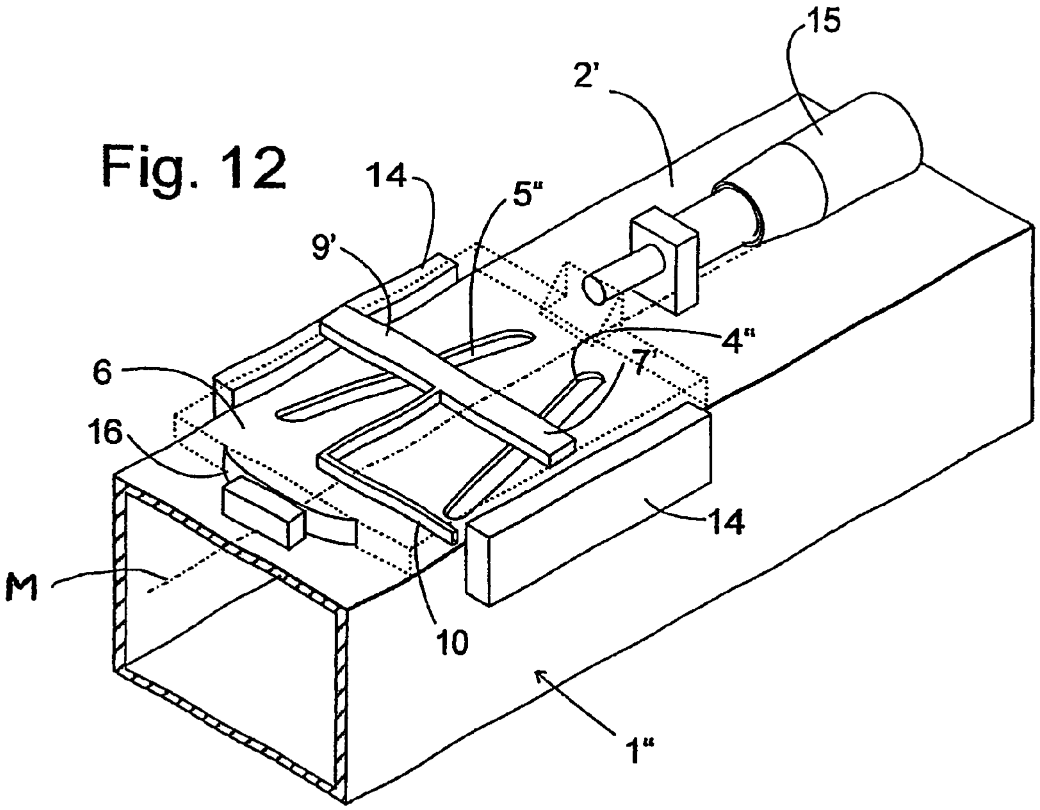
FIG. 12 shows a perspective view of a sixth embodiment of the coupling device according to the invention.

FIG. 12 shows another embodiment of the coupling device in which the substrate 6 and the strip lines 7', 9' are identical to those in FIG. 3, while the waveguide section 1", on the other hand, is modified. Its slits 4", 5" run symmetrically to each other but inclined to the nodal plane x=a/2. The substrate 6 is displaceable in controlled manner parallel to the nodal plane with the aid of laterally arranged guide rails 14, a micrometer screw 15 and a spring 16, in order thus to position the strip lines 7', 9' over regions of the slits 4", 5" at different spacings. As already stated in the explanation above concerning the operation of the device, on displacement of the strip lines 7', 9' the coupling varies, on the one hand, because the spacing of the crossing points 12 from each other and from the free ends 13 changes and therefore the interference of the two signals induced in the two strip lines alters and, on the other hand, because the fields to which the strip lines 7', 9' are exposed are all the stronger the nearer the crossing points 12 lie to the side walls of the waveguide section 1". It is thus possible to set the coupling between the waveguide section 1' and the strip lines 7', 9' at any time precisely to a currently-required value by displacing the substrate 6 along the Z-axis.

Naturally, with the embodiments in FIGS. 3 and 6 to 9, a rail guide may be employed for controlled displacement of the substrate transverse to the nodal plane x=a/2. Similarly, it is possible to permanently fix the substrate 6 on the waveguide section 1" of FIG. 12 in a position selected in beforehand according to a desired coupling strength, e.g. by cementing.

A plurality of the aforementioned coupling devices may be arranged along a single waveguide. The spacing between the individual coupling devices should then be half the wavelength $\lambda_H$ of the wave in the waveguide, so that the residual scattering fields of the individual coupling devices cancel each other out in the radiation zone.

What is claimed is:

1. A waveguide coupling device, comprising: a waveguide section in which a guided wave is propagated in at least one waveguide mode, the waveguide section having a first slit in one of its walls to form a slotted wall, the at least one waveguide mode having a field component parallel to the slotted wall with a nodal plane oriented in a longitudinal direction of the waveguide section and inducing in the walls of the waveguide section a wall current distribution with just said nodal plane; a first antenna section bridging the first slit; and a second slit in the slotted wall, the two slits lying on different sides of the nodal plane.

2. The coupling device according to claim 1, in that the two slits are arranged in regions of opposing equal field strength of the parallel field component.

3. The coupling device according to claim 1, in that a locus of one of the two slits is a reflection of the other of the two slits with respect to the nodal plane.

4. The coupling device according to claim 1, in that a locus of one of the two slits is an inverted reflection of the other of the two slits with respect to the nodal plane.

5. The coupling device according to claim 1, in that one free end of the first antenna section is placed at a spacing of $\lambda_s/4$ from the first slit, wherein $\lambda_s$ is a wavelength of an oscillation induced in the first antenna section by the guided wave.

6. The coupling device according to claim 1, in that the waveguide section has a rectangular cross-section, and in that the at least one waveguide mode is an $H_{10}$ mode.

7. The coupling device according to claim 1, in that a second antenna section bridges the second slit.

8. The coupling device according to claim 7, in that the antenna sections are linked at a point in parallel with a connecting conductor, in that the antenna sections cross the first and second slits in respectively opposing directions, and in that the antenna sections have a total length L, wherein $(n-3/8)\lambda_s<L<(n+3/8)\lambda_s$, wherein n is an integer, and wherein $\lambda_s$ is a wavelength of an oscillation induced in the antenna sections by the guided wave.

9. The coupling device according to claim 7, in that the antenna sections are joined at a point in parallel with a connecting conductor, in that the antenna sections cross the first and second slits in the same direction, and in that the antenna sections have a total length L, wherein $(n+1/8)\lambda_s<L<(n+7/8)\lambda_s$, wherein n is an integer, and wherein $\lambda_s$, is a wavelength of an oscillation induced in the antenna sections by the guided wave.

10. The coupling device according to claim 7, in that the antenna sections are linked in series with a connecting conductor, in that the antenna sections cross the first and second slits in opposing directions, and in that a spacing between the slits measured along the antenna sections is between $(n-3/8)\lambda_s$ and $(n+3/8)\lambda_s$, wherein n is an integer, and wherein $\lambda_s$ is a wavelength of an oscillation induced in the antenna sections by the guided wave.

11. The coupling device according to claim 7, in that the antenna sections are linked in series with a connecting conductor, in that the antenna sections cross the first and second slits in the same direction, and in that a spacing between the slits measured along the antenna sections is between $(n+1/8)\lambda_s$ and $(n+7/8)\lambda_s$, wherein n is an integer, and wherein $\lambda_s$ is a wavelength of an oscillation induced in the antenna sections by the guided wave.

12. The coupling device according to claim 7, in that a crossing point of the antenna sections and the slits lies on a line perpendicular to a longitudinal direction of the waveguide section.

13. The coupling device according to claim 7, in that the antenna sections are positioned at different positions transverse to the nodal plane.

14. The coupling device according to claim 1, in that the first and second slits are parallel to each other and to the nodal plane.

15. The coupling device according to claim 1, in that the first and second slits run inclined to the nodal plane.

16. The coupling device according to claim 15, in that the first and second slits are arranged in a rotatable wall section of the waveguide section.

17. The coupling device according to claim 7, in that the first and second slits have a spacing varying along the nodal plane, and in that the antenna sections are positionable at different positions along the nodal plane.

18. The coupling device according to claim 7, and an apparatus for adjusting the antenna sections relative to the slits.

19. The coupling device according to claim 7, in that the antenna sections are strip line sections arranged on a substrate.

20. The coupling device according to claim 1, in that further slits are formed in the slotted wall of the waveguide section at a spacing of $(n+1/2)\lambda_H$, wherein $\lambda_H$ is a wavelength of the guided wave in the waveguide section.

* * * * *